US00RE38613E1

(19) United States
(12) Reissued Patent
Kawai et al.

(10) Patent Number: US RE38,613 E
(45) Date of Reissued Patent: Oct. 5, 2004

(54) METHOD FOR GROWING A NITRIDE COMPOUND SEMICONDUCTOR

(75) Inventors: Hiroji Kawai, Kanagawa (JP); Tsunenori Asatsuma, Kanagawa (JP); Fumihiko Nakamura, Kanagawa (JP)

(73) Assignee: Sony Corporation, Tokyo (JP)

(21) Appl. No.: 10/174,289

(22) Filed: Sep. 18, 2002

Related U.S. Patent Documents

Reissue of:
(64) Patent No.: 6,043,140
Issued: Mar. 28, 2000
Appl. No.: 08/867,964
Filed: Jun. 3, 1997

(30) Foreign Application Priority Data

Jun. 17, 1996 (JP) ..... P08-177042

(51) Int. Cl.[7] ..... H01L 21/04
(52) U.S. Cl. ..... 438/503
(58) Field of Search ..... 438/933, 510, 438/509, 643, 503

(56) References Cited

U.S. PATENT DOCUMENTS 4,792,467 A * 12/1988 Melas et al. ..... 427/248.1
5,209,952 A * 5/1993 Erdmann et al. ..... 427/255.6
5,393,565 A * 2/1995 Suzuki et al. ..... 427/255.391
5,468,678 A * 11/1995 Nakamura et al. ..... 438/509
5,587,014 A * 12/1996 Iyechika et al. ..... 117/90

OTHER PUBLICATIONS

Ponce, F.A. et al. "Gallium Nitride and Related Materials" Materials Research Society, Pittsburg, PA. pp. 91–96, 1996.*
"Gallium Nitride and Related Materials." First International Symposium. Eds: Ponce, F.A.; Dupuis, R.D.; Nakamura, S.; Edmond, J.A. SO Pittsburgh, PA, USA: Mater. Res. Soc, 19 pp 91–96. 1996.*

* cited by examiner

*Primary Examiner*—Carl Whitehead, Jr.
*Assistant Examiner*—Craig Thompson
(74) *Attorney, Agent, or Firm*—Sonnenschein, Nath & Rosenthal LLP

(57) ABSTRACT

A new and improved method for growing a p-type nitride III-V compound semiconductor is provided which can produce a p-type nitride compound semiconductors having a high carrier concentration, without the need for annealing to activate impurities after growth. In a preferred embodiment, a p-type nitride compound semiconductor, such as p-type GaN, is grown by metal organic chemical vapor deposition methods using a nitrogen source material which does not release hydrogen during release of nitrogen and the semiconductor is grown in an inactive gas. The nitrogen source materials may be selected from nitrogen compounds that contain hydrogen [radicals] *groups* and alkyl [radicals] *groups* and/or phenyl [radicals] *groups* provided that the total amount of hydrogen [radicals] *groups* is less than or equal to the sum total of alkyl [radicals] *groups* and phenyl [radicals] *groups* present in the nitrogen compound used as the nitrogen source material.

10 Claims, 1 Drawing Sheet

METHOD FOR GROWING A NITRIDE COMPOUND SEMICONDUCTOR

Matter enclosed in heavy brackets [ ] appears in the original patent but forms no part of this reissue specification; matter printed in italics indicates the additions made by reissue.

BACKGROUND OF THE INVENTION

The present invention relates to a method for growing a nitride compound semiconductor. More particularly, it relates to a new and improved method for growing a GaN or other nitride III-V compound semiconductor.

GaN, AlGaN, GaInN and other nitride III-V compound semiconductors have band gaps ranging from 1.8 eV to 6.2 eV, and they theoretically may be used to provide light emitting devices capable of emitting infrared to ultraviolet light and for this reason, these metal nitride compound semiconductors are being studied by engineers.

To fabricate light emitting diodes (LED) or semiconductor lasers using nitride III-V compound semiconductors, it is necessary to stack layers of AlGaN, GaInN, GaN, etc. and to sandwich a light emitting layer (active layer) between an n-type cladding layer and a p-type cladding layer.

To grow a p-type GaN layer, for example, by metal organic chemical vapor deposition or other vapor phase growth in a conventional technique, trimethylgallium (TMG, $Ga(CH_3)_3$) as Ga source, ammonia ($NH_3$) as N source, and cyclopentadienyl magnesium ($CP_2Mg$) as a p-type dopant, for example, are supplied onto a heated substrate, such as sapphire substrate, SiC substrate or GaAs substrate, in hydrogen ($H_2$) carrier gas or mixed gas containing $H_2$ and nitrogen ($N_2$), to grow a Mg-doped GaN layer by heat decomposition reaction. Since the Mg-doped GaN layer has a high resistance immediately after the growth, it is subsequently annealed in a vacuum or in an inert or inactive gas to change it into a p-type semiconductor layer. It is considered that the change into a p-type occurs because Mg in GaN is activated and releases carriers.

However, the carrier concentration of the p-type GaN layer obtained in the above-mentioned process is around only $3\times10^{17}$ $cm^{-3}$, and the resistance still remains undesirably high. Therefore, the use of a nitride III-V compound semiconductor in a semiconductor laser presents some difficulties. A first problem attendant on the use of a p-type GaN layer as a contact layer for the p-side electrode arises because the p-type GaN layer has a high resistance and a large voltage loss may occur in the p-type GaN layer when the laser is operated with a high electric current. A second problem arises because of a low carrier concentration of the p-type GaN layer, which causes a contact resistance as high as $10^{-2}$ $cm^2$ between the p-type GaN layer and the p-side electrode. This causes a voltage loss of approximately 10 V along the interface between the p-type GaN layer and the p-side electrode while the semiconductor laser is operated in a typical inrush current density, 1 $kA/cm^2$, and causes a deterioration in laser characteristics. A third problem is that the need for an annealing step for activating the impurity after growth of the Mg-doped GaN layer causes an increase in the number of steps required to perform the manufacturing process.

The above problems concerning p-type GaN also apply to fabrication of a p-type layer of any nitride III-V compound semiconductor or, more generally, a nitride compound semiconductor, other than GaN.

SUMMARY OF THE INVENTION

It is therefore an object of the invention to provide a method for growing a nitride compound semiconductor, which provides fabrication of a p-type nitride compound semiconductor with a high carrier concentration, which does not need to be annealed after growth of the semiconductor to activate the p-type impurity therein.

After considerable research directed to solving these conventional technical problems, it has now been discovered that a p-type nitride compound semiconductor with a high carrier concentration may be obtained by preventing generation of active hydrogen during formation of the semiconductor and that it is very important to select an appropriate nitrogen source material and an appropriate carrier gas.

In accordance with an embodiment of the invention, a carrier gas other than $H_2$ is used preferably because $H_2$, when caught into grown crystal, inactivates Mg used, for example, as a p-type impurity. Suitable carrier gases which may be employed in accordance with this embodiment are inert or non-reactive carrier gases, such as, argon (Ar), helium (He) and Nitrogen ($N_2$), for example. From the economical viewpoint, $N_2$ is most inexpensive.

In accordance with an embodiment, a nitrogen source should be used that does not release $H_2$. This does not mean that the nitrogen source cannot contain a hydrogen [radical] *group* (—H). When both a methyl [radical] *group* (—$CH_3$) and a hydrogen [radical] *group* (—H) are contained in a single molecule, there is a high probability that they join and form stable methane ($CH_4$). Therefore, an essential condition of molecules to be used as a nitrogen source material is that the number of hydrogen [radicals] *groups* should be equal to or less than the number of methyl [radicals] *groups*, per molecule of the nitrogen source. For example, trimethylhydrazine, ($(CH_3)_2N—NH(CH_3)$) is decomposed as $$(CH_3)_2N—NH(CH_3)\rightarrow N(CH_3)_2+N(CH_3)\rightarrow 2N+C_2H_6+CH_4 \quad (1)$$

and does not release hydrogen.

A nitrogen source material having ethyl (—$C_2H_5$) [radicals] *groups* instead of methyl [radicals] *groups* behaves somewhat differently. For example, a possible decomposition reaction of diethyl amine ($HN(C_2H_5)_2$) is $$HN(C_2H_5)_2\rightarrow NH_3+2C_2H_4 \quad (2)$$

Another possible decomposition reaction is:

$$HN(C_2H_5)_2\rightarrow NC_2H_5+C_2H_6\rightarrow NH+C_2H_6+C_2H_4 \quad (3)$$

These are decomposition reactions that release hydrogen. In Equations (2) and (3), ethylene is produced. The decomposition and formation of ethyl [radicals] *groups* into ethylene is called β-elimination decomposition which is very liable to occur in organic metal compounds such as triethylgallium (TEG, $Ga(C_2H_5)_3$). However, it is believed that β-elimination decomposition is unlikely to occur in ethyl compounds containing group V elements such as As and N (for example, Appl. Organometal Chem. vol. 5, 331(1991)). For these materials, the decomposition reaction proceeds as follows:

$$HN(C_2H_5)_2\rightarrow N+C_2H_6+C_2H_5 \quad (4)$$

and the reaction does not release hydrogen. Therefore, ethyl [radicals] *groups* may be regarded the same as methyl [radicals] *groups*, and also other alkyl [radicals] *groups* may be regarded the same as methyl [radicals] *groups*.

Aromatic ring hydrocarbons having phenyl [radicals] *groups* ($C_6H_5$—) are hydrocarbons which do not exhibit β-elimination. Aromatic ring hydrocarbons are very stable, and need a large energy for their decomposition. Amines having a phenyl [radical] *group* coupled to nitrogen, e.g. phenylmethylamine ($C_6H_5$—$NH(CH_3)$), is decomposed in accordance with the reaction formula:

$$C_6H_5—NH(CH_3)\rightarrow C_6H_5—N+CH_4\rightarrow N+CH_4+C_6H_5 \quad (5)$$

and does not release hydrogen. In this respect, phenyl [radicals] *groups* may be regarded equivalent to methyl [radicals] *groups*. The same also applies to higher order aromatic ring hydrocarbons, such as naphthalene. In general, however, they are disadvantageous because of a high vapor pressure.

Taking the above factors into account, nitrogen source materials suitable for obtaining p-type III-V compound semiconductors with a higher carrier concentration are $NR_3$, $NHR_2$, etc. as amine compounds, RN═NR, HN═NR, etc. as azo compounds, $R_2N—NH_2$, $R_2N—NHR$, $R_2N—NR_2$, RHN—NRH, RHN—NR'H, RHN—$NR'_2$ etc. as hydrazine compounds, and $R—N_3$, etc. as azide compounds, where R is an alkyl [radical] *group* or a phenyl [radical] *group* (—$C_6H_5$), and H is a hydrogen [radical] *group* (—H).

In accordance with the present invention, in an embodiment, the group III element materials used for the growth a nitride III-V compound semiconductor also do not release hydrogen. Trimethylgallium (TMG, $Ga(CH_3)_3$), for example, does not release hydrogen during decomposition, and therefore is suitable as a Group III elemental source.

However, triethylgallium (TEG, $Ga(C_2H_5)_3$) is decomposed by a β-elimination reaction, as follows:

$$Ga(C_2H_5)_3)\rightarrow GaH_3+3C_2H_4 \quad (6)$$

and generates galane ($GaH_3$), leaving hydrogen on the grown surface. In this respect, TEG is considered an unfavorable material. However, considering that the amount of a group V material supplied, in general, is hundreds of times the amount of a group III material, if trimethylamine is used as a nitrogen material, methyl [radicals] *groups* are theoretically hundreds times the amount of $GaH_3$ and consume $GaH_3$. That is, since the amount of supply of the group III material is overwhelmingly small, generation of hydrogen from the group III material can be disregarded.

Gallium chloride (GaCl) may also be used in a chloride method. From the review made above, there is substantially no restriction on group III materials.

In accordance with the present invention, in an embodiment, a new and improved method for growing a nitride compound semiconductor, comprising the step of:

growing a nitride compound semiconductor in vapor phase by using a nitrogen source material which does not release hydrogen during release of nitrogen.

In a preferred embodiment of the invention, the nitride compound semiconductor is grown in vapor phase in an inactive gas. Usable as the inactive gas are, for example, Ar, He and $N_2$.

Typically used as the nitrogen source material is a nitrogen compound that contains a hydrogen [radical] *group*, an alkyl [radical] *group* and/or a phenyl [radical] *group*, and the number of the hydrogen [radicals] *groups* is not more than the total number of the alkyl [radical] *group* or [radicals] *groups* and the phenyl [radical] *group* or [radicals] *groups* taken together. Preferred nitrogen compounds are selected from amine compounds, azo compounds, hydrazine compounds, azide compounds, and the like, and a suitable compound is selected from any of these aforementioned compounds, depending on the type of the nitride compound semiconductor to be grown. Especially preferred amine compounds are trimethylamine, dimethylamine, triethylamine and diethylamine.

In accordance with the invention, a nitride compound semiconductor is provided in the form of a nitride III-V compound semiconductor containing N and at least one group III element selected from the group consisting of Al, Ga and In. Typical examples of the nitride III-V compound semiconductor are GaN, AlGaN and GaInN.

The p-type impurity of the p-type nitride compound semiconductor may be selected from at least one Group II element, such as, Mg, Zn and Cd.

The nitride compound semiconductor is typically grown in vapor phase by metal organic chemical vapor deposition (MOCVD).

The method for growing a nitride compound semiconductor having the above composition according to the invention, by using a nitrogen source material that does not releasing hydrogen during release of nitrogen, prevents hydrogen from being caught in the grown crystal and inactivating the dopants or impurities or carriers. Therefore, a p-type nitride compound semiconductor with a high carrier concentration can be obtained without annealing being required for activation of an impurity after growth of the nitride compound semiconductor.

Other objects and advantages provided by the present invention will become apparent from the following Detailed Description of the Invention taken in conjunction with the Drawings, in which:

DETAILED DESCRIPTION OF THE PREFERRED EMBODIMENTS

In accordance with a preferred embodiment of the invention, before a p-type GaN layer is grown on a c-plane sapphire substrate, an undoped GaN buffer layer is grown on the c-plane sapphire substrate by conventional MOCVD, and thereafter, a p-type GaN layer is grown thereon. A GaN buffer layer made by conventional MOCVD has a sufficiently high quality, and characteristics of a p-type GaN layer grown on it can be investigated clearly. In accordance with an embodiment, a p-type layer is grown on an n-type layer to make a semiconductor laser, or the like, and in these cases, the p-type layer frequently must be grown on a GaN surface already made.

Preferably, the GaN buffer layer may be grown in the following known manner. First, a c-plane sapphire substrate is put in a reaction furnace of a MOCVD apparatus, and the surface of the c-plane sapphire substrate is cleaned by annealing at 1050° C. for 20 minutes in a mixed gas containing $H_2$ gas at a flow rate of 8 l/min and $N_2$ gas at a flow rate of 8 l/min. Thereafter, the temperature of the substrate is decreased to about 510° C., and 40 μmol/min of TMG as a source material of Ga and 0.4 mol/min of ammonia as a source material of N are supplied to the reaction furnace to grow an undoped 25 nm thick GaN buffer layer on the c-plane sapphire substrate. After that, while ammonia is continuously supplied to the reaction furnace, the substrate temperature is elevated to 1000° C., TMG is again supplied to grow the undoped GaN buffer layer to the thickness of 2 μm. The growth pressure used here is 250 Torr.

In accordance with a preferred embodiment, a p-type GaN layer is grown on the surface of the buffer layer. In this embodiment, trimethylamine ($(CH_3)_3N$) is used as the source material of N for growing the p-type GaN layer.

Figure 1:
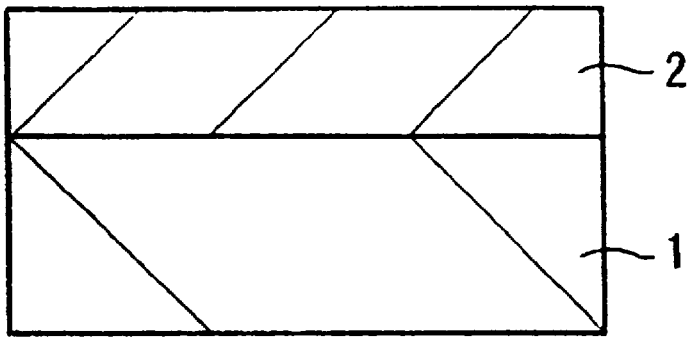
FIG. 1 is an elevated cross-sectional view of a substrate having an undoped GaN buffer layer formed thereon preparatory to growth of a nitride III-V compound semiconductor layer thereon in accordance with the method of the present invention.

Referring now to FIG. 1, the c-plane sapphire substrate 1 having the undoped GaN buffer layer 2 prepared in the above-mentioned process was put in the reaction furnace of the MOCVD apparatus.

Figure 2:
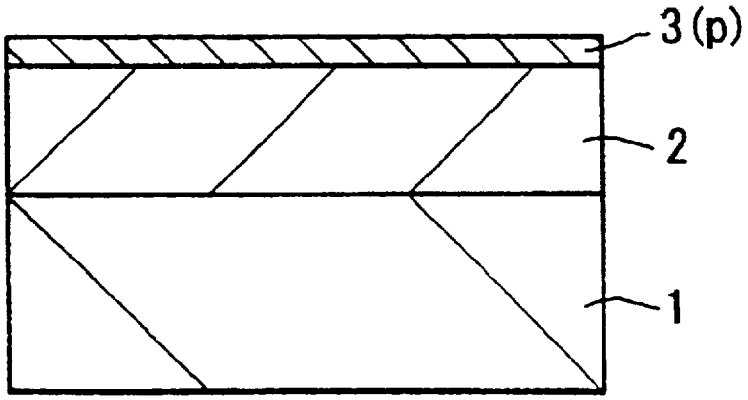
FIG. 2 is an elevated cross-sectional view of the substrate shown in FIG. 1, having a nitride III-V compound semiconductor layer deposited thereon.

Thereafter, an $N_2$ carrier gas alone was introduced into the reaction furnace and the substrate temperature was increased. When the temperature exceeded 500° C., 2 mmol/min of trimethylamine ($(CH_3)_3N$) was introduced as the source material of N, and the substrate temperature was held at 850° C. After that, 10 μmol/min of TMG as the source material of Ga and 25 μmol/min of cyclopentadienyl magnesium ($CP_2Mg$) as a p-type dopant were supplied to the reaction furnace for two hours to grow a p-type GaN layer 3 doped with Mg as a p-type impurity as shown in FIG. 2. The thickness of the p-type GaN layer 3 was estimated approximately 0.2 μm by calculation from the amount of supply of TMG.

The c-plane sapphire substrate 1 having the p-type GaN layer 3 grown in the above process was divided into 5 mm square pieces, and electrodes of Ni/Au dots (not shown) were formed at four corners. Then, Hall measurement TM was conducted by the Van der Pauw method to determine the carrier concentration (hole concentration) of the p-type GaN layer 3. As a result, the carrier concentration at room temperatures was $5.5\times10^{18}$ $cm^{-3}$, a higher carrier concentration than conventional values, which was obtained without annealing for activation of the impurity after growth. The mobility of the p-type GaN layer was 1.5 $cm^2/Vs$. The value of the mobility is not large probably because the p-type GaN layer 3 is as thin as 0.2 μm or because the crystallographic quality might be slightly worse than that by a conventional method.

According to the first embodiment shown above, by using trimethylamine ($(CH_3)_3N$) as the nitrogen source gas material and by growing the p-type GaN layer 3 in the $N_2$ carrier gas by MOCVD, a p-type GaN layer 3 with a higher carrier concentration than a conventional value can be obtained without annealing for activation of the impurity after growth. The p-type GaN layer 3 is suitable for use as a contact layer for a p-side electrode in a GaN semiconductor laser, for example.

In accordance with an alternate embodiment, a method for growing a p-type GaN layer is provided wherein 1,1-dimethylhydrazine ($(CH_3)_2N—NH_2$) is used as the nitrogen source gas material for growing the p-type GaN layer.

In this second embodiment, like the first embodiment, the c-plane sapphire substrate 1 having the grown undoped GaN buffer layer 2 was put in the reaction furnace of the MOCVD. After $N_2$ carrier gas was introduced into the reaction furnace, the substrate temperature was increased. When the temperature exceeded 500° C., 2 mmol/min of 1,1-dimethylhydrazine ($(CH_3)_2N—NH_2$) as the source material of N was supplied, and the substrate temperature is held at 850° C. After that, 10 μmol/min of TMG as the source material of Ga and 25 μmol/min of dimethyl zinc (DMZ, $Zn(CH_3)_2$) as the p-type dopant are supplied into the reaction furnace for two hours to grow the p-type GaN layer 3 doped with Zn as the p-type impurity. The thickness of the p-type GaN layer 3 was estimated to be approximately 0.2 μm by calculation from the amount of supply of TMG.

The surface morphology of the p-type GaN layer 3 grown in the above process was better than the p-type GaN layer 3 grown by the first embodiment, and the p-type GaN layer 3 exhibited a completely polished surface.

The carrier concentration of the p-type GaN layer 3 was measured by the same method as that of the first embodiment. The carrier concentration was $6\times10^{17}$ $cm^{-3}$, a higher carrier concentration than conventional, which was obtained without annealing. The mobility of the p-type GaN layer 3 was 6 $cm^2/Vs$.

The carrier concentration of the p-type GaN layer 3 grown by the second embodiment was lower by one order of magnitude than the carrier concentration of the p-type GaN layer 3 grown by the first embodiment. A possible reason is that hydrogen produced by decomposition of 1,1-methylhydrazine ($(CH_3)_2N—NH_2$) was caught in the crystal. 1,1-dimethylhydrazine referred to above is believed to decompose as follows:

$$(CH_3)_2N—NH_2 \rightarrow N(CH_3)_2+NH_2 \rightarrow 2N+C_2H_6+H_2 \quad (7)$$

and hydrogen produced from the excessive supply of hydrazine and caught into the crystal may cause the observed decrease in the concentration of the carriers.

According to the second embodiment shown above, by using 1,1-methylhydrazine ($(CH_3)_2N—NH_2$) and growing the p-type GaN layer 3 in $N_2$ carrier gas by MOCVD, the p-type GaN layer 3 with a higher carrier concentration than conventional values can be obtained without annealing for activation of the impurity after growth.

In accordance with a third embodiment, the present invention provides a new and improved method for growing a p-type GaN layer wherein 1,2-dimethylhydrazine ($(HCH_3)N—NH(CH_3)$) is used as the source material of N.

Since 1,2-dimethylhydrazine is considered to be decomposed mainly in accordance with the reaction:

$$H(CH_3)N—NH(CH_3) \rightarrow 2NH(CH_3) \rightarrow 2N+2CH_4 \quad (8)$$

generation of hydrogen is considered much less than that of the second embodiment, and a further improvement in carrier connection is expected.

According to the third embodiment shown above, by using 1,2-dimethylhydrazine ($H(CH_3)N—NH(CH_3)$) and growing the p-type GaN layer 3 in $N_2$ carrier gas by MOCVD, the p-type GaN layer 3 with a higher carrier concentration than conventional values can be obtained without annealing for activation of the impurity after growth.

Although the invention has been explained by way of some specific embodiments, modifications or changes may be made therein by those skilled in this art. For example, the relative proportions of ingredients, the relative flow rates of the reactive gases, the recited temperatures and the relative layer thickness obtained may be varied as desired. All such obvious changed may be made herein by those skilled in this without departing from the scope and spirit of this invention.

As explained above, since the method for growing a nitride III-V compound semiconductor according to the invention uses a nitrogen source material which does not release hydrogen during the release of nitrogen, the carrier inactivating contamination by active hydrogen into the crystal of the nitride compound semiconductor during its growth is prevented and accordingly, a p-type nitride III-V compound semiconductor having a high carrier concentration may be prepared in a single deposition step without a separate annealing step being required for activation of the impurity after growth.

What is claimed is:

1. A method for growing a III-V nitride compound semiconductor comprising the step of growing a III-V nitride compound semiconductor in vapor phase by using a nitrogen source material which does not release hydrogen during release of nitrogen and which prevents hydrogen from being caught in the grown crystal and inactivating dopants, impurities and/or carriers, and a Group III element source material, said nitrogen source material being supplied in an amount of hundreds of times the amount of the Group III element source material, said nitrogen source material comprising an amine compound selected from the group consisting of secondary amines of the formula $HNR^1R^2$ and tertiary amines of the formula $R^1R^2R^3N$, wherein $R^1$, $R^2$ and $R^3$ are each independently methyl, ethyl or phenyl.

2. A method as defined in claim 1, wherein the nitride compound semiconductor is a p-type semiconductor.

3. A method as defined in claim 1, wherein said Group III element source material comprises at least one Group III element selected from the group consisting of Al, Ga and In.

4. A method as defined in claim 1, wherein in said growing step, said III-V nitride compound semiconductor is grown in vapor phase by metal organic chemical vapor deposition methods.

5. A method for growing a III-V nitride compound semiconductor comprising the step of growing III-V compound semiconductor in vapor phase by using a nitrogen source material which does not release hydrogen during release of nitrogen and which prevents hydrogen from being caught in the grown crystal and inactivating dopants, impurities and/or carriers, and a Group III element source material, said nitrogen source material being supplied in an amount of hundreds of times the amount of the Group III element source material, said nitrogen source material being selected from the group consisting of:

(A) an amine compound selected from the group consisting of secondary amines of the formula $HNR^1R^2$ and tertiary amines of the formula $R^1R^2R^3N$, wherein $R^1$, $R^2$ and $R^3$ are each independently methyl, ethyl or phenyl;

(B) an azo compound;

(C) a hydrazine compound selected from the group consisting of: 1,1-dephenyl hydrazine, 1-methyl-1-phenyl hydrazine, 1-ethyl-1-phenyl hydrazine, 1-phenyl-2-methyl hydrazine, 1-phenyl-2-ethyl hydrazine, 1,2-diphenyl-1-methyl hydrazine, 1,2-dephenyl-1-ehtyl hydrazine, 1,2-diphenyl-2-methyl hydrazine, 1,2-dipheny-2-ethyl hydrazine, 1,2-diphenyl-1,2-dimethyl hydrazine and 1,2-diphenyl-1,2-diethyl hydrazine; and (D) an azide compound.

6. A method as defined in claim 1, wherein the III-V nitride compound semiconductor in vapor phase is grown in an inactive gas.

7. A method as defined in claim 1, wherein the nitrogen source material includes at least one alkyl [radical] *group* or phenyl [radical] *group* and, optionally, at least one hydrogen [radical] *group*, wherein the number of the hydrogen [radicals] *groups* is less than or equal to the total number of the alkyl [radicals] *groups* and the phenyl [radicals] *groups*.

8. A method as defined in claim 1, wherein the nitrogen source material is trimethylamine.

9. A method as defined in claim 1, wherein the nitrogen source material is supplied in an amount greater than one hundred and less than a thousand times the amount of the Group III element source material.

10. A method for growing a III-V nitride compound semiconductor comprising the step of growing a III-V nitride compound semiconductor in a vapor phase by using:

a nitrogen source material that does not release hydrogen during release of nitrogen and which prevents hydrogen from being caught in the grown crystal and inactivating dopants, impurities, and/or carriers, said nitrogen source material comprising an amine compound selected from the group consisting of secondary amines of the formula $HNR^1R^2$ and tertiary amines of the formula $R^1R^2R^3N$, wherein $R^1$, $R^2$, and $R^3$ are each independently methyl, ethyl or phenyl, a Group III element source material, said nitrogen source material being supplied in an amount of hundreds of times the amount of the Group III element source material, and a Group II element source gas material comprising at least one Group II element selected from the group consisting of magnesium, zinc, and cadmium.

* * * * *